United States Patent [19]
Bird

[11] Patent Number: 6,078,358
[45] Date of Patent: Jun. 20, 2000

[54] MULTIPLEXER CIRCUIT USING ELECTRICAL SWITCHING

[75] Inventor: Neil C. Bird, Horley, United Kingdom

[73] Assignee: U.S. Philips Corporation, New York, N.Y.

[21] Appl. No.: 08/757,532

[22] Filed: Nov. 27, 1996

[30] Foreign Application Priority Data

Dec. 1, 1995 [GB] United Kingdom .................... 9524657
Jul. 10, 1996 [GB] United Kingdom .................... 9614480

[51] Int. Cl.[7] ..................................................... H04N 3/14
[52] U.S. Cl. ........................ 348/310; 348/308; 250/208.1
[58] Field of Search .......................... 250/208.1; 257/443, 257/444, 445; 348/294, 297, 298, 300–304, 308–312, 315–324; H04N 3/14, 5/335

[56] References Cited

U.S. PATENT DOCUMENTS

| | | | |
|---|---|---|---|
| 5,119,202 | 6/1992 | Hashimoto | 348/302 |
| 5,371,351 | 12/1994 | Van Berkel | 250/208.1 |
| 5,572,015 | 11/1996 | Bird | 348/311 |
| 5,572,257 | 11/1996 | Conrads | 348/308 |
| 5,754,155 | 5/1998 | Kubota | 345/98 |
| 5,856,666 | 1/1999 | Moulsley | 250/208.1 |

*Primary Examiner*—Tuan Ho
*Assistant Examiner*—Ngoc-Yen Vu
*Attorney, Agent, or Firm*—Steven R. Biren

[57] ABSTRACT

A multiplexer circuit includes switches 26 or 260 each having a hold portion 120 or 1200 and driving portion 110 or 1100 for providing a hold voltage or a select voltage to an output 14. If all control inputs 28A or 280A are at a first level, then the output has the select voltage, whereas if one input 28A is at a second level, the output has the hold voltage. The switches 26 may be integrated onto the substrate of a diode-based array of electrical elements, for example image sensing pixels. In this case, the output 14 includes a row conductor for a row of such pixels.

20 Claims, 9 Drawing Sheets

| CONTROL LINE | X,Y,Z | X',Y',Z' | B | B' |
|---|---|---|---|---|
| FIRST LEVEL | 5V | 0V | 5V | 0V |
| SECOND LEVEL | −7.5V | 7.5V | −2.5V | 2.5V |

| CONTROL LINE | X,Y,Z | B | $V_h$ | $V_l$ |
|---|---|---|---|---|
| HIGH LEVEL | 12V | 10V | 2ᵥ | -2ᵥ |
| LOW LEVEL | -12V | -15V | | |

| NUMBER OF PAIRS OF CONTROL LINES 29A (FIRST EMBODIMENT) NUMBER OF CONTROL LINES 290A (SECOND EMBODIMENT) | NUMBER OF BLOCKS | NUMBER OF ROWS PER BLOCK | NUMBER OF ROWS | NUMBER OF MULTIPLEXER INPUTS (FIRST EMBODIMENT) | NUMBER OF MULTIPLEXER INPUTS (SECOND EMBODIMENT) |
|---|---|---|---|---|---|
| 4 | 417 | 6 | 2502 | 842 | 423 |
| 6 | 125 | 20 | 2500 | 262 | 133 |
| 8 | 36 | 70 | 2520 | 88 | 46 |
| 10 | 10 | 252 | 2520 | 40 | 22 |
| 12 | 3 | 924 | 2772 | 30 | 17 |
| 14 | 1 | 3432 | 3432 | 30 | 17 |

FIG. 12

MULTIPLEXER CIRCUIT USING ELECTRICAL SWITCHING

BACKGROUND OF THE INVENTION

This invention relates to the addressing of arrays of electrical elements and concerns a multiplexer circuit for driving such an array. In particular, the invention concerns a row multiplexer for an array of device elements formed with thin-film circuitry. The device elements may be image sensor elements (for example photosensitive diodes) of a large area image sensor, or display elements of a flat panel display (for example a liquid crystal display), or several other types of device element.

Addressing an array of device elements in rows and columns requires each element to be connected to a unique pair of row and column conductors. In the case of an image sensor, a resolution of 300 dpi (dots per inch) may be required so that for an A4 large area image sensor, 2,500 and 3,500 rows and columns are required respectively (with the rows parallel to the long side of the A4 page). Problems therefore arise in forming the interconnections to the large area circuit and the use of multiplexer circuits which are integrated with the large area array circuit is desired, so as to reduce the number of connections to the integrated circuit.

Published European Patent Application EP-A-0633 542 (our reference PHB 33858) discloses such an electronic device comprising an array of device elements which are arranged in rows and columns and which are coupled to row and column conductors. The row conductors are each connected to a multiplexer circuit which comprises a reset line and a select line. The two lines are connected together by a pair of series-connected diodes with a pair of such diodes for each row conductor. The row conductor is connected to the junction of the two diodes, so that when the two diodes associated with a row conductor are in a conducting state, the row conductor is held at a voltage defined by the potential divider action of the two diodes. The diodes are photosensitive diodes which are switched from a blocking state to a conductive state by illumination from a corresponding arrangement of light sources. When EP-A-0 633 542 concerns an image sensor array having photosensitive diodes and switching diodes as the image sensor pixels, the invention described in EP-A-0 633 542 permits the row multiplexer circuits to be fabricated with diodes and using the same technology type as the device elements of the array. However, the row multiplexer circuits require alignment of the light sources with the photosensitive diodes of the multiplexer circuit. Depending on the type of light source used, the switching of the light source may also introduce an undesirable delay in the switching of the multiplexer circuit.

SUMMARY OF THE INVENTION

The present invention seeks to provide a multiplexer circuit for an array, the operation of the circuit using electrical switching rather than optical switching, and which may be fabricated using diode-based technology and provides a high multiplexer ratio.

According to the present invention there is provided a multiplexer circuit for addressing a plurality of electrical elements, comprising a plurality of switching circuits each for supplying a hold voltage or a select voltage to an associated electrical element, each switching circuit including an output which is connected to the associated electrical element, a driving circuit for driving the output to the select voltage, and a holding circuit for driving the output to the hold voltage, each switching circuit comprising a plurality of select control inputs each having a respective first control level and a respective second control level, wherein all of the control inputs are driven to the first control level to enable the driving circuit and wherein one or more of the control inputs are driven to the second control level to disable the driving circuit, each switching circuit comprising a different combination of select control inputs selected from a plurality of control lines of the multiplexer circuit.

The multiplexer switch used in the multiplexer circuit of the invention is turned on (the driving circuit being enabled) only when all of the control inputs are at a first control level. Thus, if each switching circuit has a number, n, of control inputs, then setting n control lines of the multiplexer circuit to the first level will result in an individual switching circuit being activated. The multiplexer ratio therefore equates to the number of possible ways of selecting n lines from the total number of control lines of the multiplexer circuit, and this gives rise to a high multiplex ratio.

The holding circuit may be disabled when the driving circuit is enabled, and the holding circuit may be enabled when the driving circuit is disabled. As a result, the hold and select voltages may be independently selectable.

In a first embodiment the select control inputs comprise associated pairs of select control inputs, a first group of select control inputs comprising one input from each pair of select control inputs, and a second group of select control inputs comprising the other input from each pair of select control inputs, each pair of select control inputs being driven to their respective first or second control levels substantially simultaneously, and wherein the driving circuit includes an AND gate which supplies the select voltage to the output when all of the first group of control inputs are at the first control level, and the holding circuit comprises an OR gate which supplies the holding voltage to the output when any of second group of control inputs are at the second control level.

The use of an AND gate for the driving circuit and an OR gate for the holding circuit enables the multiplexer circuit to be fabricated from all-diode technology, since AND and OR gates may be fabricated using diode based circuits.

Preferably, the outputs of the holding circuit and of the driving circuit each comprise a voltage divider arrangement. This enables the hold voltage and the select voltage to be defined by a voltage divider so that there are minimal delays in switching between these two voltages arising from capacitor charging or discharging time constants. Preferably, the voltage divider arrangement has the form of a diode divider circuit.

The holding circuit in the first embodiment preferably comprises at least two series connected diodes connected between each associated pair of control inputs, the point of connection of each pair of switching elements being connected to the output of the switching circuit, such that when the select control inputs are each driven to the first control level, the diodes are turned off, and when at least one pair of select control inputs is driven to the second control level, the associated diodes are turned on and the output is determined by the respective values of the second control levels of the at least one pair of select control inputs.

This arrangement defines the diode voltage divider output of the holding circuit.

Preferably, the driving circuit in the first embodiment comprises first and second series connected drive switching circuits connected between drive inputs, the point of connection of the two drive switching circuits being connected to the output of the switching circuit, one of the two groups of select control inputs (discussed above) being connected to the first drive switching circuit, and the other group of select control inputs being connected to the second drive switching circuit, such that when the control inputs are each driven to the first control level the first and second drive switching circuits are turned on and the output is determined by the respective values of the first and second drive inputs, and when at least one pair of control inputs is driven to the second control level the first and second drive switching circuits are turned off.

In this way the select voltage supplied by the driving circuit comprises a voltage defined at the mid point of the two drive switching circuits. Preferably, each drive switching circuit includes an AND gate comprising a first diode connected between the associated drive input and a control port of the drive switching circuit, and a second diode connected between the control port of the drive switching circuit and the output of the switching circuit, the select control inputs each being connected to the control port through respective diodes, such that a current either flows between the drive input and the output of the switching circuit in the on condition of the drive switching circuit, or between the drive input and one or more control inputs, the second diode being reverse biased, in the off condition of the drive switching circuit.

In this way, the output of the drive circuit is a voltage divider output defined between diodes.

The drive inputs may comprise block select lines with the electrical elements being divided into a plurality of blocks each having a plurality of electrical elements.

In a second embodiment, the driving circuit includes an AND gate, the output of which is coupled to the associated electrical element when all of the control inputs are driven to the first control level, and is isolated from the electrical element when one or more control inputs are driven to the second control level, the holding circuit supplying a holding voltage to the electrical element when the output of the AND gate is isolated from the electrical element.

Again, the use of an AND gate enables the circuit to be fabricated from all diode technology. Also, the output of the AND gate may be coupled to the associated electrical element through a respective diode which is forward biased when all of the control inputs are driven to the first control level and which is reverse biased when one or more control inputs are driven to the second control level. In this way, a diode also provides isolation of the driving circuit from the holding circuit.

The holding circuit preferably also comprises a diode based circuit in the form of a voltage source which defines the hold voltage when the output of the AND gate is isolated from the electrical element, and which, in combination with the driving circuit, defines the voltage at the output when all of the control inputs are driven to the first control level.

Again, the switching circuit may be arranged in blocks, each block effectively having an individual supply for the AND gate of the driving circuit.

BRIEF DESCRIPTION OF THE DRAWING

These and other features of the present invention, and their advantages, are illustrated specifically in the embodiment of the invention now to be described, by way of example, with reference to the accompanying drawings, in which:

FIG. 12 is a table showing the number of multiplexer inputs required, for different multiplexer circuit arrangements, to address an array of image sensor elements arranged in 2,500 rows.

It should of course be understood that like reference numerals are used throughout the text to refer to like parts.

DESCRIPTION OF THE PREFERRED EMBODIMENTS

Figures 3, 4:
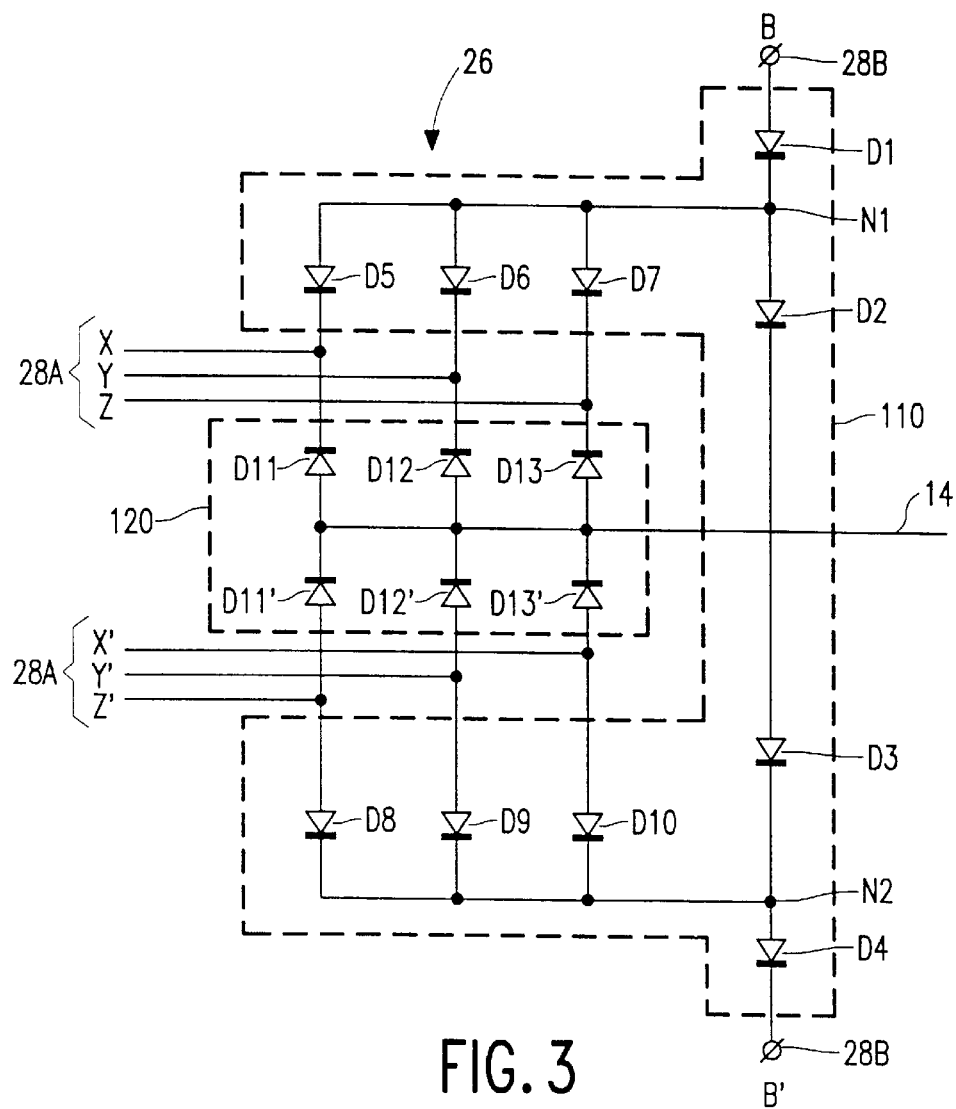
FIG. 3 shows a first embodiment of a multiplexer switching circuit according to the invention.
FIG. 4 is a table giving voltage levels for operating the switching circuit of FIG. 3.

As shown in FIG. 3, the invention provides a multiplexer circuit comprising switches 26 which enable individual electrical elements (rows 14) to be addressed. Each switching circuit includes a driving circuit 110 for providing a select pulse and a holding circuit 120 for providing a hold pulse to the row 14. The output of these two circuits is defined by a voltage divider arrangement, and in the example of FIG. 3 the holding circuit and driving circuit are enabled and disabled mutually exclusively, using control inputs 28.

Figure 1:
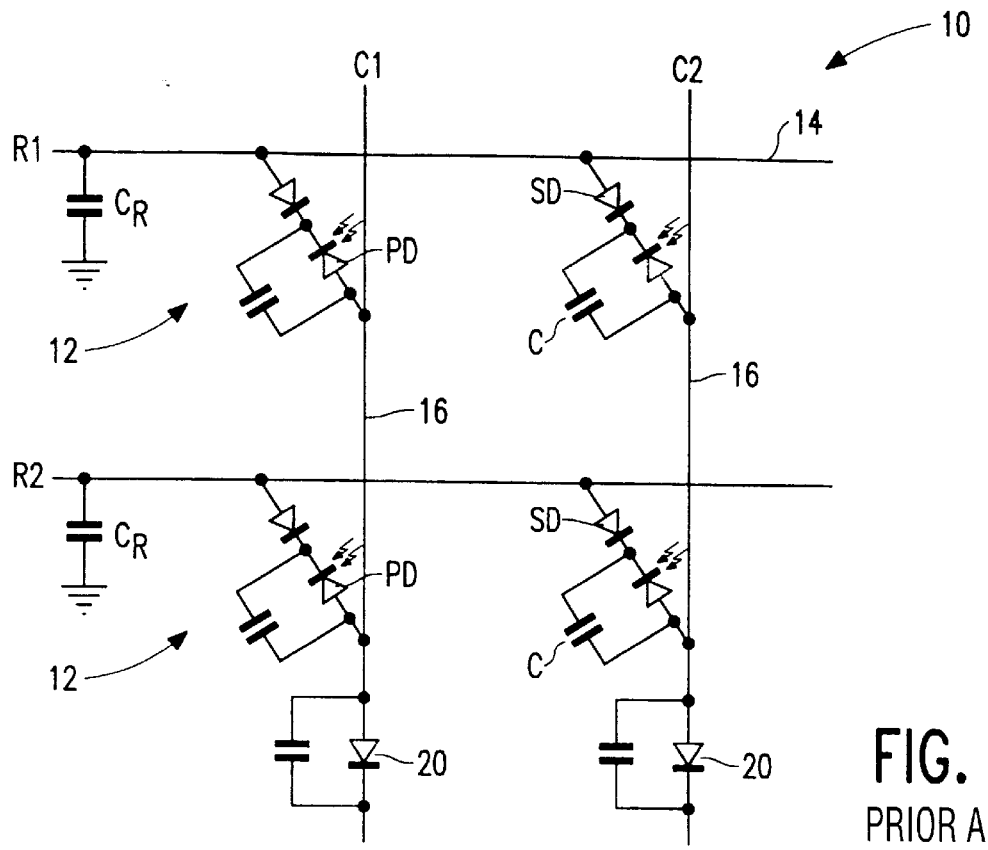
FIG. 1 is a diagram to explain the operation of an image sensor pixel.

FIG. 1 shows an example of four pixels of a known charge storage device in the form of an image sensor 10. Although only four pixels 12 are shown, the image sensor 10 will comprise a two dimensional matrix of rows and columns of pixels with associated row 14 and column 16 conductors.

Each pixel 12 comprises a photo sensitive diode PD and a switching diode SD coupled in series between the associated row conductor 14 and column conductor 16. In the example shown, the switching diode SD and photodiode PD are arranged with the cathodes coupled together, although they may be connected oppositely. The capacitor C is shown coupled across the photosensitive diode PD. This capacitor C may be the parasitic capacitance of the photosensitive diode PD or may be an additional capacitor added to increase the dynamic range of the image sensor 100.

Figure 2:
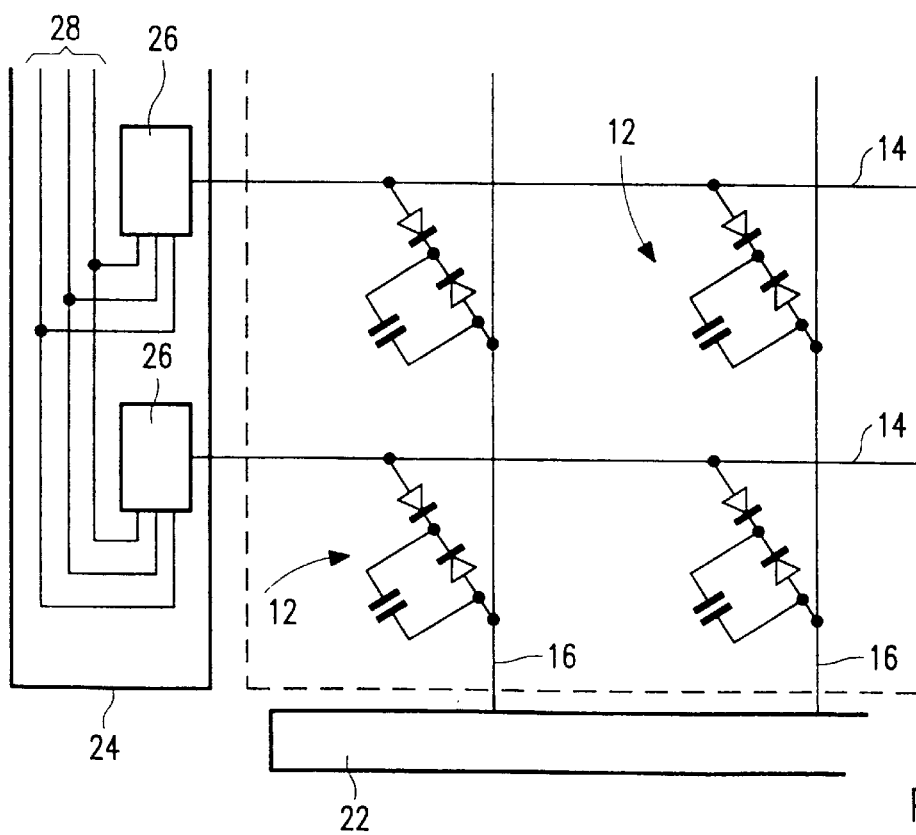
FIG. 2 shows a conventional image sensor device in which the row driver circuit includes multiplexer switching circuits.

An image sensor is shown in FIG. 2, and comprises a column circuit 22 which includes charge sensitive amplifiers for reading the charge transferred from each pixel 12 to the associated column conductor 16, as well as a row driver circuit 24. The invention concerns a multiplexer which is particularly suitable for use as an interface to the row driver circuitry. The general principle behind the use of multiplexer circuits within the row driver circuit 24 is known and is illustrated in FIG. 2. The row driver circuit 24 includes multiplexer switches 26 to which are supplied control lines 28. The signals applied to the control lines 28 enable individual multiplexing switches 26 to be activated, so that an individual row 14 of pixels 12 may be selected. Of course, the number of control lines 28 is much lower than the number of rows 14 and therefore of switching circuits 26.

Various multiplexing circuits have been proposed, and these are concerned with the problem that the row driver circuit 24 is not integrated on to the substrate of the image sensor array, so that interconnections must be provided between each row 14 and the row driver circuit 24. The use of the multiplexer circuit 26, which may be integrated on to the substrate of the image sensor array, reduces the number of connections which must be made to the image sensor array.

The invention concerns a multiplexer circuit, and in particular a multiplexer switch, which is suitable for integration onto the substrate of the large area array and which provides a high multiplexer ratio.

FIG. 3 shows a first multiplexer switch 26 according to the invention.

The purpose of the multiplexing switch 26 is to act as an addressing circuit which selectively supplies either a select voltage or a holding voltage to the row conductor 14. For this purpose, the switching circuit 26 includes a driving portion 110 for supplying a select voltage to the row conductor 14, and a holding portion 120 for supplying a hold voltage to the row conductor 14.

The multiplexer switch 26 has two sets of control lines 28, a first set 28A, which control whether the driver portion 110, or the holding portion 120 of the multiplexer switch 26 is enabled, and a second set 28B which determines whether the multiplexer switch 26 is, as a whole, turned on or off.

The driver portion 110 of the switch 26 comprises four series connected diodes D1 to D4 which extend between a first terminal B and a second terminal B'. The two terminals B and B' together define the select voltage which is to be applied on the row conductor 14, as will be explained in the following. The row conductor 14 is connected to the mid point of the chain of four diodes D1 to D4, namely between diodes D2 and D3. A first node N1 is defined between diodes D1 and D2, and a second node N2 is defined between diodes D3 and D4. The diodes D1 to D4 are connected in series with the same polarity, so that a current may flow between terminal B and terminal B' if the diodes are all forward biased. In such a case, the voltage to be applied to the row conductor 14 is defined as the mid point of the voltages at nodes N1 and N2, assuming that the diodes D2 and D3 have similar switching characteristics.

The first set of control lines 28A are divided into a first group of terminals X, Y, Z and a second group of terminals X',Y',Z'. The driver portion 110 of the switch 26 further comprises diodes D5, D6, D7 which are connected between first nodal point N1 and the first group X, Y, Z, of control lines, respectively. The diodes D5, D6, D7 are oriented such that they each may define a current path from the terminal B, through the diodes D1,D5,D6,D7, to the associated control line of the first group of control lines X, Y, Z.

Similarly, the driver portion 110 comprises diodes D8, D9, D10 which are connected between the second group of terminals X',Y',Z' and the second nodal point N2. In this way, the diodes D8, D9, D10 may provide a conducting path between the second group of control lines X', Y', Z' through the diode D4 to the terminal B'.

The combination of diodes D1, D5, D6 and D7 may be considered as an AND gate. Thus, if control lines X, Y, Z are each high (relative to terminal B) such that the diodes D5, D6 and D7 are reverse biased, then the voltage on the nodal point N1 will be determined by the terminal B, whereas if any one of the control lines X, Y, Z is driven to a low value (relative to terminal B), such that one or more of the diodes D5, D6, D7 conducts, then the voltage at the nodal point N1 is pulled down.

Similarly, the diodes D4, D8, D9 and D10 may be considered as forming an OR gate, since if any one of the control lines X', Y', Z' is high (relative to the terminal B') then a current will flow between that control line X', Y' or Z' to the terminal B', thus pulling the voltage of the node N2 high. If all of the control lines X', Y', Z' are low (relative to the terminal B') then the diodes D8, D9 and D10 do not conduct and the voltage at the nodal point N2 is determined solely by the terminal B'.

The holding portion 120 comprises a number of pairs of series connected diodes, D11, D11', D12, D12' and D13, D13'. Each pair of series connected diodes extends between a control line from the second group X', Y', Z' to the associated control line from the first group X, Y, Z. The point of connection of each pair of diodes is connected to the row conductor 14. When each control line from the first group, X, Y, Z is at a higher potential than the associated control line in the second group X', Y', Z' then all of the pairs of diodes are reverse biased and the holding portion 120 has no effect upon the voltage applied to the row conductor 14. However, if any control line from the first group, X, Y, Z is at a lower potential than the associated control line from the second group X', Y', Z' then the associated pair of diodes conduct and the voltage on the row conductor 14 is defined by the potential divider action of the pair of diodes. Thus, the holding portion 120 may be considered as an OR gate since it provides a hold voltage when a certain condition is satisfied for any pair of associated control lines.

The operation of the switch 26 shown in FIG. 3 is as follows. The control lines 28 are arranged into associated pairs of control lines X,X', Y,Y' and Z,Z', as described above. Thus, one control line from the first group X, Y, Z is associated with one control line from the second group X',Y',Z', of the first set 28A of control lines. Each control line has a first level and a second level, and an associated pair of control lines are switched substantially simultaneously. Furthermore, when a control line in the first group is at a high level, the associated control line in the second group is at a low level and vice versa. Thus, taking the holding portion 120, the voltages are arranged such that when a pair of control lines, for example X and X', are at the first level (X is high and X' is low) the associated pair of diodes D11, D11' are both reverse biased and isolated from the row conductor 14. Alternatively, when the pair of control lines are at the second level (X is low and X' is high) the associated pair of diodes D11, D11' conduct and the row conductor voltage 14 is defined at the mid point of the high level for X' and low level for X. This voltage is arranged to represent the holding voltage for the row conductor 14. Furthermore, the levels applied to each of the first group of control lines X, Y, Z are equal and the voltage levels applied to the second group of control lines X', Y', Z' are also equal. In this way, when any one or more pairs of control lines from the first set 28A are driven to the second level, the row conductor 14 is held at the holding voltage for the row. The holding portion 120 can therefore be considered to be an OR gate which drives the row conductor 14 to the holding voltage when any one of the second group of control lines X', Y', Z' is driven high.

The driving portion 110 is also controlled by the control lines 28. In this case, when all of the first group of control lines X, Y, Z are high, and therefore all of the second group X', Y', Z' are low, the AND gate defined by diodes D5, D6 and D7 is turned on, so that the output at node N1 is driven high by the terminal B, and the OR gate defined by D8, D9, and D10 is turned off, so that the output at node N2 is pulled low by terminal B'. In this case, the diodes D5 to D10 are all reverse biased and have no influence on the voltages at the nodes N1 and N2. Consequently, the voltage on the row conductor 14 is simply the mid point of the voltages at terminal B and B'. Of course, this assumes that terminal B is at a higher voltage then terminal B'. If the switch 26 is to be turned off, the control line B is switched low and the control line B' is switched high, and this possibility will be explained in greater detail in the following.

The operation of the holding portion 120 and the driving portion 110 is therefore mutually exclusive; the holding portion is enabled when the driving portion is disabled, and the driving portion is enabled and the holding portion is disabled. This mutual exclusivity enables the hold voltage and the select voltage to be independently selectable, with no interaction between the hold portion 120 and select portion 110 of the switch. As will be described in the following, a simple switch circuit may be employed if this constraint is not present. Clearly, for the switch of FIG. 3, the voltage levels for the control lines must be selected such that there is no interference between the two portions 110, 120 of the switching circuit 26.

FIG. 4 shows one possible set of voltages that may be applied to the control terminals, in order to obtain a holding voltage of 0 Volts and a select voltage of 2.5 Volts. When the holding portion 120 is turned off, the first group of control lines X, Y, Z are each at 5 Volts and the second group X', Y', Z' are each at 0 Volts, which is the case when all of the control lines are at the first voltage level. The diode pairs D11,D11' to D13,D13' are each reverse biased and play no part in determining the voltage on the row conductor 14. The drive input B is at 5 Volts and the input B' at 0 Volts, so that the four diodes D1 to D4 conduct and the row conductor 14 is held at the potential of 2.5 Volts (assuming similar switching characteristics for the diodes D1 to D4). The diodes D5 to D10 are reverse biased and the driving circuit is effectively turned on and the holding circuit turned off. The voltage on the row conductor 14 generated by the driving circuit also has no effect upon the diode pairs D11 to D13. In other words, the voltage level of 2.5 Volts on the row conductor 14 does not cause any of the diodes D11 to D13 to become forward biased. The voltage applied to the row conductor 14 in this case comprises a voltage divider potential and therefore the switching of the multiplexer switch 26 into this state does not involve charging or discharging of any capacitive loads, so that switching may take place quickly.

If any of the control lines 28 are switched to the second level, then the holding circuit is enabled and the driving circuit disabled. In this case, at least one of the pairs of diodes D11,11' to D13,D13' conduct and the row conductor 14 is held at a voltage which is a mid point of the second levels of the control lines. Assuming control lines X and X' are switched to the second level, so that control line X is at −7.5 Volts and control line X' is at 7.5 Volts, the mid point of the diodes D11 and D11' will be held at 0 Volts, which corresponds to the holding voltage. In this case, the diode D5 is also turned on and the current flows between terminal B to terminal X so that the nodal point N1 is in this case held at −1.25 Volts (or lower if more than one of the diodes D5 to D7 conducts, since the resistance to the −7.5 V level drops), causing the diode D2 to be reverse biased, thereby disabling the driving circuit 110. Similarly, the diode D8 conducts so that a current flows between terminal X' and terminal B' and the nodal point N2 is defined at +1.25 Volts, so that diode D3 is reverse biased. The voltage of 0 V on the row conductor, set by the holding portion 120, plays a part in reverse biasing the diodes D2 and D3. Again, the voltage supplied to the row conductor 14 is the result of a diode potential divider circuit so that higher switching speeds may be obtained between the hold and select condition of the multiplexer switch 26.

The switch shown in FIG. 3 has eight inputs comprising the pairs of inputs B, X, Y and Z. Of course, the circuit may be extended by the addition of more control lines in the first set 28A, so that for example, a 10 to 12 input switch could be constructed. The choice of the number of control lines depends upon the use of the switch in the multiplexer circuit and the desired multiplexer ratio.

Figures 5, 6:
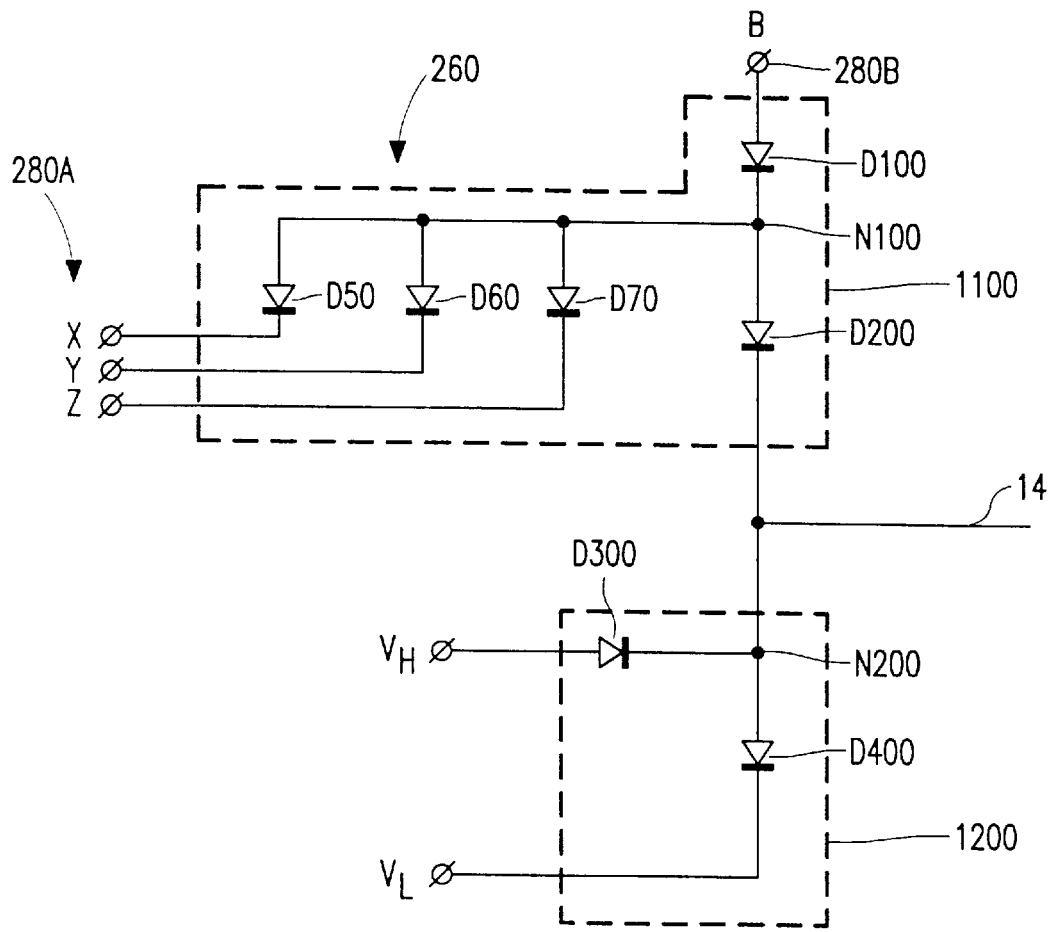
FIG. 5 shows a second embodiment of a multiplexer switching circuit according to the invention.
FIG. 6 is a table giving voltage levels for operating the swithcing circuit of FIG. 5.

An alternative switch arrangement is shown in FIG. 5, which requires fewer diodes and fewer control terminals, but which maintains the same operating principle. Thus, the multiplexer switch 260 includes a driving portion 1100 for supplying a select voltage to the row conductor 14, and a holding portion 1200 for supplying a hold voltage to the row conductor 14.

The multiplexer switch 260 has a first set of control lines 280A, which control whether the driver portion 1100 is enabled, and a second control line 280B which determines whether the multiplexer switch 260 as a whole is turned on or off.

In this second embodiment, the driver portion 1100 of the switch 260 comprises two series connected diodes D100 and D200 connected between a first terminal B and the output of the switch 260. A first node N100 is defined between diodes D100 and D200 and, as in the first embodiment, the voltage at node N100 determines whether the driving portion 1100 controls the output which is applied to the row conductor 14 or whether the holding circuit 1200 determines this output voltage.

The driver portion 1100 of the switch 260 also comprises diodes D50, D60, D70 which are connected between the nodal point N100 and the group 280A of control lines X, Y, Z, respectively. In the same way as in the first embodiment, the combination of diodes D100, D50, D60 and D70 may be considered as an AND gate with node N100 as the output. The terminal B can be considered as the voltage supply of the AND gate. Thus, if control lines X, Y, Z are each high (relative to terminal B) such that the diodes D50, D60 and D70 are reverse biased, then the voltage on the nodal point N100 will be determined by the terminal B, whereas if any one of the control lines X, Y, Z is driven to a low value (relative to terminal B), such that one or more of the diodes D50, D60, D70 conducts, then the voltage at the nodal point N100 is pulled down. The circuit is arranged such that this results in reverse bias of diode D200.

The holding portion 1200 comprises two series connected diodes D300, D400 connected between a constant high voltage source $V_H$ and a constant low voltage source $V_L$. Thus, if the holding portion 1200 is isolated from external voltage inputs a constant voltage is developed at the nodal point N200 between the two diodes D300, D400.

The operation of the switch 260 shown in FIG. 5 is as follows. As in the first embodiment, each control line 280A has a high level and a low level. When the driving portion 1100 is disabled because one or more of the control lines 280A are driven low, the diode D200 is reverse biased because the node N100 is held at a potential which is lower than the constant potential defined by the isolated holding portion 1200 at node N200. As a result, the driving portion 1100 is indeed isolated from the holding portion 1200 so that the holding portion alone defines the voltage on the row conductor 14. Consequently, the voltages at the high and low terminals $V_H$, $V_L$ are defined such that the voltage at node N200 is equal to the required holding voltage. In this case the switch 260 is effectively turned off. As in the first embodiment, the voltage at the row conductor 14 is defined by a potential divider comprising the two diodes D300 and D400. Similarly, if the second terminal 280B is driven to a low value then diodes D100 and D200 will both be reverse biased and the voltage at the row conductor 14 will again be defined by the holding portion 1200. This is the case when the multiplexer switch 260 as a whole is turned off- this is the case when the switch is in a block of switches which is not selected for operation, as will be explained further in the following.

As explained above, the switch 260 is turned on when each of the control inputs X, Y, Z of the first set 280A are driven high. This has the effect of reverse biasing the diodes D50, D60, D70 so that they play no role in determining the voltage at the node N 100. In this case, when the control line 280B is high so that the switch as a whole is turned on, driver portion 1100 and the holding portion 1200 interact in order to define the row voltage for row conductor 14. Thus, the voltage at node N200 is no longer determined solely by the terminals $V_H$ and $V_L$, but instead the two diodes D100 and D200 come into play. The output voltage on row conductor 14 will be defined by the potential divider action of diodes D100, D200 and D400 connected between the voltages at terminal B and $V_L$ if diode D300 is reverse biased. This is the situation when the select voltage is higher than the voltage at terminal $V_H$. If, however, the select voltage is lower than the voltage at terminal $V_H$ then diode D300 will be forward biased and also play a role in determining the correct voltage. However, in either case there is an increase in the voltage applied to the row conductor 14 compared to that provided by the holding portion 1200 alone.

The operation of the driver portion 1100 and the holding portion 1200 is no longer mutually exclusive. The design of the diodes which constitute the driver portion 1100 and the holding portion 1200 must therefore be considered in combination in order to achieve the desired hold voltage and select voltage to be applied to the row conductor 14. However, the simplified structure of the multiplexer switch 260 shown in FIG. 5 enables a reduction in the number of diodes required for each switch and also enables a reduction in the total number of control lines which must supply the multiplexer circuit.

FIG. 6 shows a possible set of voltages that may be applied to the control terminals of the multiplexer switch 260 of the second embodiment, in order to obtain a holding voltage of 0 Volts and a select voltage of 2 Volts, assuming the diodes all have identical switching characteristics.

Taking the situation when the switch as a whole is turned on, the voltage at terminal 280B is 10 Volts. If the individual switch is turned off, the terminals, X, Y, Z are each driven low to −12 Volts so that node N100 is at a negative potential and the diode D200 is reverse biased, the holding portion 1200 applying a voltage of 0 Volts to the row conductor 14. If, alternatively, the terminals X, Y, Z are each driven high to 12 Volts then the diodes D50, D60, D70 are all reverse biased so that the output voltage is determined from diodes D100, D200 and D400. The three diodes extend between potentials of 10 Volts at terminal B and −2 Volts at terminal $V_L$ resulting in a voltage at the row conductor 14 of 2 Volts. The diode D300 thereby plays no part in determining the select voltage for the row conductor 14.

If the switch as a whole is turned off, by switching terminal B to a potential of −15 Volts, then the node N100 is at a negative potential irrespectively of the signals applied to the terminals X, Y, Z, and the driving portion 1100 thereby plays no part in determining the voltage on the row conductor 14. Those skilled in the art will appreciate that the voltage levels given in FIG. 6 are merely one example of the possible alternatives. Diode D300 may also play a part in determining the voltage on the row conductor 14 and the switching characteristics of the various diodes may be different in order to achieve the desired voltage levels on the row conductor 14. However, it is not possible to select the control levels for the holding portion 1200 and the driving portion 1100 independently in order to achieve the desired output voltages.

Figure 7:
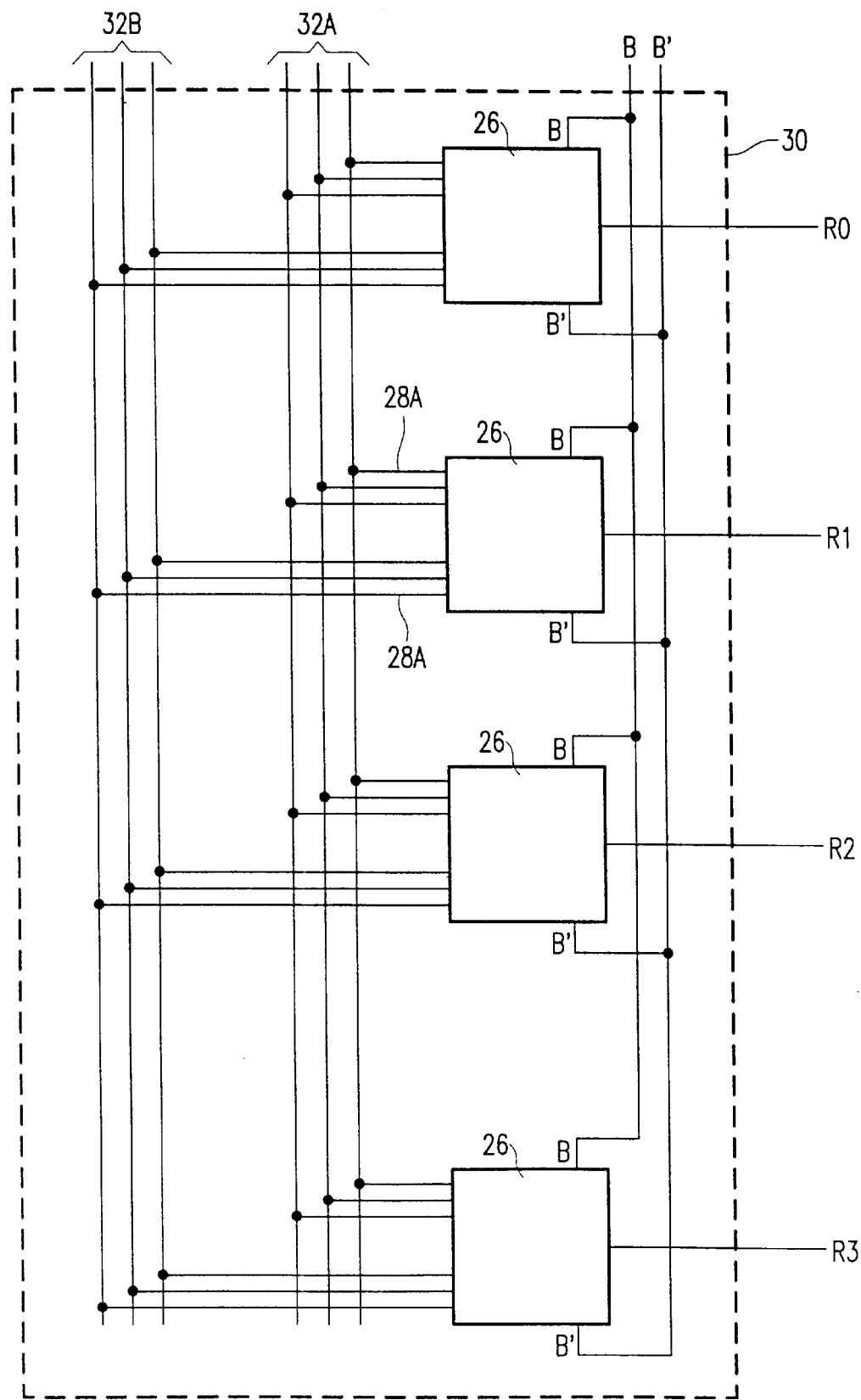
FIG. 7 shows a multiplexer circuit according to the invention, using switches of the first embodiment.

FIG. 7 shows a multiplexer structure using the switch shown in FIG. 3. For the purposes of explanation, each switch 26 is taken, once more, to comprise three pairs of control lines 28 in the first set 28A. The multiplexer circuit 30 is shown as addressing only four rows of an array, for the purposes of explanation. Obviously, the multiplexer circuit is for addressing a much greater number of rows of the order of 100's or 1,000's. The multiplexer ratio which may be obtained will be described in the following.

The multiplexer circuit 30 comprises addressing lines 32 also divided into pairs of addressing lines comprising one from the set 32A and one from the set 32B. Each such pair of addressing lines is switched simultaneously.

As explained above, each multiplexer circuit 26 provides a select voltage to its associated row conductor R only when all of the control lines are at the first level shown in FIG. 4. This means that all of the first group of control lines X, Y, Z must be high and all of the second group of control lines X', Y', Z' must be low. In the multiplexer 30 shown in FIG. 7, there are four pairs of addressing lines 32 and, as described above, each multiplexer switch 26 comprises three pairs of control lines 28A. Each multiplexer switch 26 is connected to a different combination of addressing lines 32, such that when any three pairs of addressing lines 32 are driven at the first level, a single multiplexer switch is turned on to drive the associated row R to the select voltage.

Mathematically, the number of combinations given by this addressing scheme is equivalent to the selection of R objects from a total P, where R represents the number of pairs of control lines 28 in the first set 28A, and P represents the number of pairs of addressing lines 32. The number of combinations M is given by:

$$M = \frac{P!}{(P-R)! \times R!} \tag{1}$$

In the multiplexer 30 shown in FIG. 5, P is equal to 4 and R is equal to 3, giving four possible combinations which are each shown in FIG. 5. The number of inputs to the multiplexer circuit is 2P+2 (P pairs of addressing lines 32 together with the pair of driving lines B and B').

In a practical image sensor, there may be approximately 2,500 rows. It is possible to address this number of rows using a multiplexer having 14 pairs of addressing lines 32 and with each multiplexer switch having seven pairs of control lines in the first set 28A of control lines. The total number of rows which may be addressed using such a circuit is 3,432 and the multiplexer requires only 30 inputs.

Figure 8:
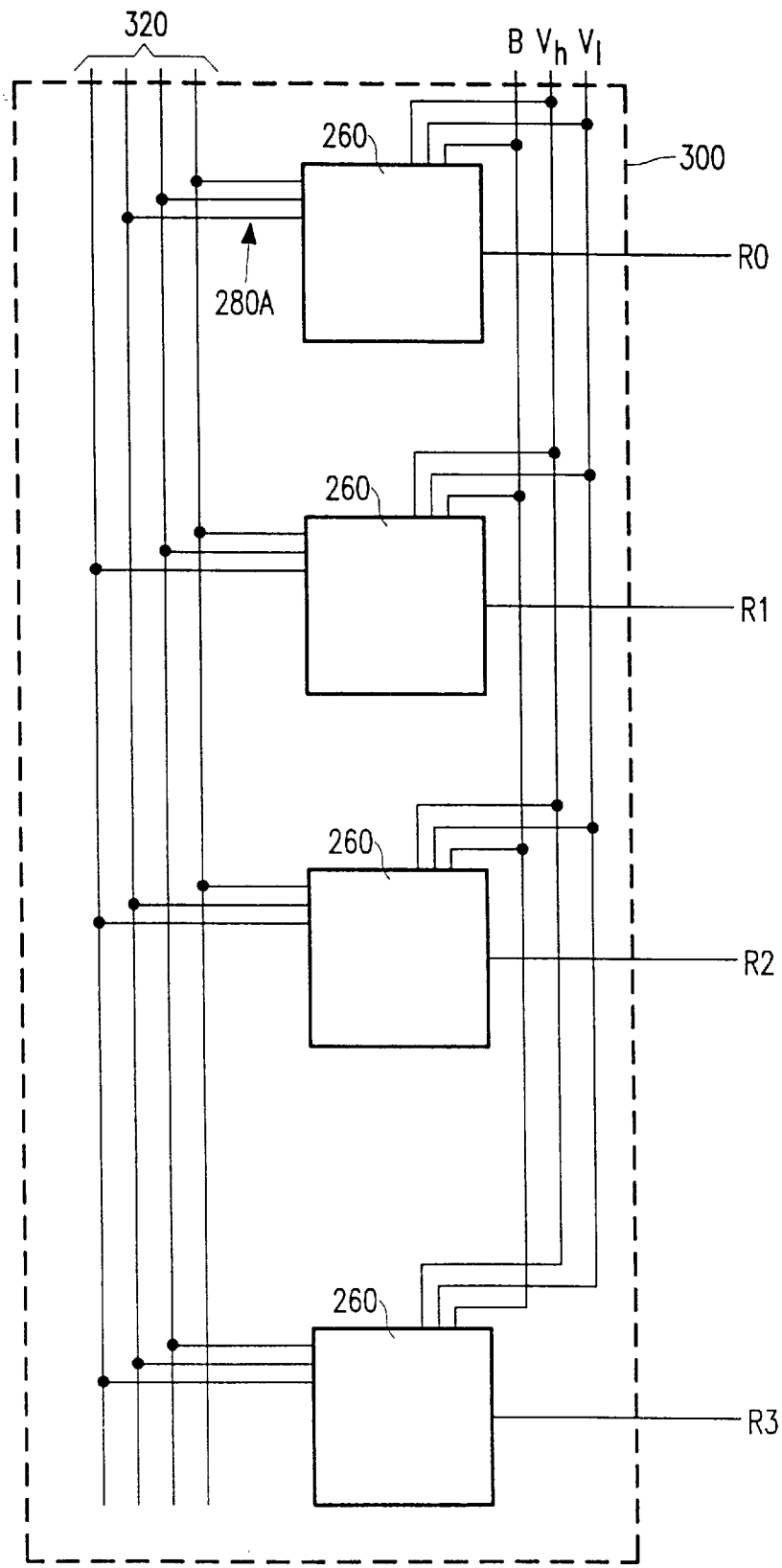
FIG. 8 shows a multiplexer circuit according to the invention, using switches of the second embodiment.

FIG. 8 shows a multiplexer structure using the switch shown in FIG. 5. The multiplexer has a very similar construction to that shown in FIG. 7 although the arrangement of control inputs is slightly different. Thus, the multiplexer circuit 300 comprises addressing lines 320 which define the first group of control lines 280A of the multiplexer switches 260. Each multiplexer switch 260 is again connected to a different combination of addressing lines 320, such that when any three addressing lines 320 are driven to a high level, a single multiplexer switch is turned on to drive the associated row R to the select voltage. Mathematical equation 1 applies again, where R represents the number of control lines in the first group 280A, and B represents the number of addressing lines 320. Again, P is equal to 4 and R is equal to 3 giving the four possible combinations which are each shown in FIG. 8. However, the number of inputs to the multiplexer circuit is now P+3. As the number of control lines increases, in order to enable addressing of a larger number of rows, the number of inputs to the multiplexer circuit using the switch of the second embodiment is significantly lower than the number of inputs required for a multiplexer circuit using the switch of the first embodiment.

One problem with the arrangement of FIGS. 7 or 8 is that a current is always flowing in each switch 26 or 260 of the multiplexer circuit 30 or 300. In the first embodiment, when a switch 26 is in the on condition, a current flows through diodes D1 to D4 which, of course, gives rise to the desired output to the row conductor 14. However, each of the switches 26 which are in the hold or off condition also have continuous currents flowing through diode D1 and one or more of diodes D5 to D7, as well as through diode D4 and one or more of D8 to D10. Consequently, the total current flowing in the multiplexer may be undesirably high. In particular, the diodes D1 to D4 need to be large enough to charge the row capacitance of the image sensor array in a sufficiently short time when a select pulse is applied to the row conductor 14. This row capacitance may be as high as 100 pF. As a result, a significant current may flow in diodes D1 and D4, which must be drained by diodes D5 to D7 and D8 to D10, even when the multiplexer switch 26 is in the off condition (i.e. providing the hold voltage).

Taking the second embodiment, when the switch 260 is in the ON condition, diodes D100, D200, D400 (and possibly D300) determine the select voltage to be applied to the row conductor 14 and the current flows through each of these diodes. However, even for a switch in the OFF condition the current must flow through diodes D100 and one or more of diodes D50, D60 or D70 in order to drive the node N100 to a lower potential so as to reverse bias diode D200. Again, D100 needs to be large enough to charge the row capacitance of the image sensor and a significant current may therefore flow in a switch 260 in the OFF condition.

It is possible to reduce the total current flowing in the multiplexer 30 or 300 by dividing the rows into blocks, each block having switching circuits 26 for addressing a number of rows associated with the block.

Figure 9:
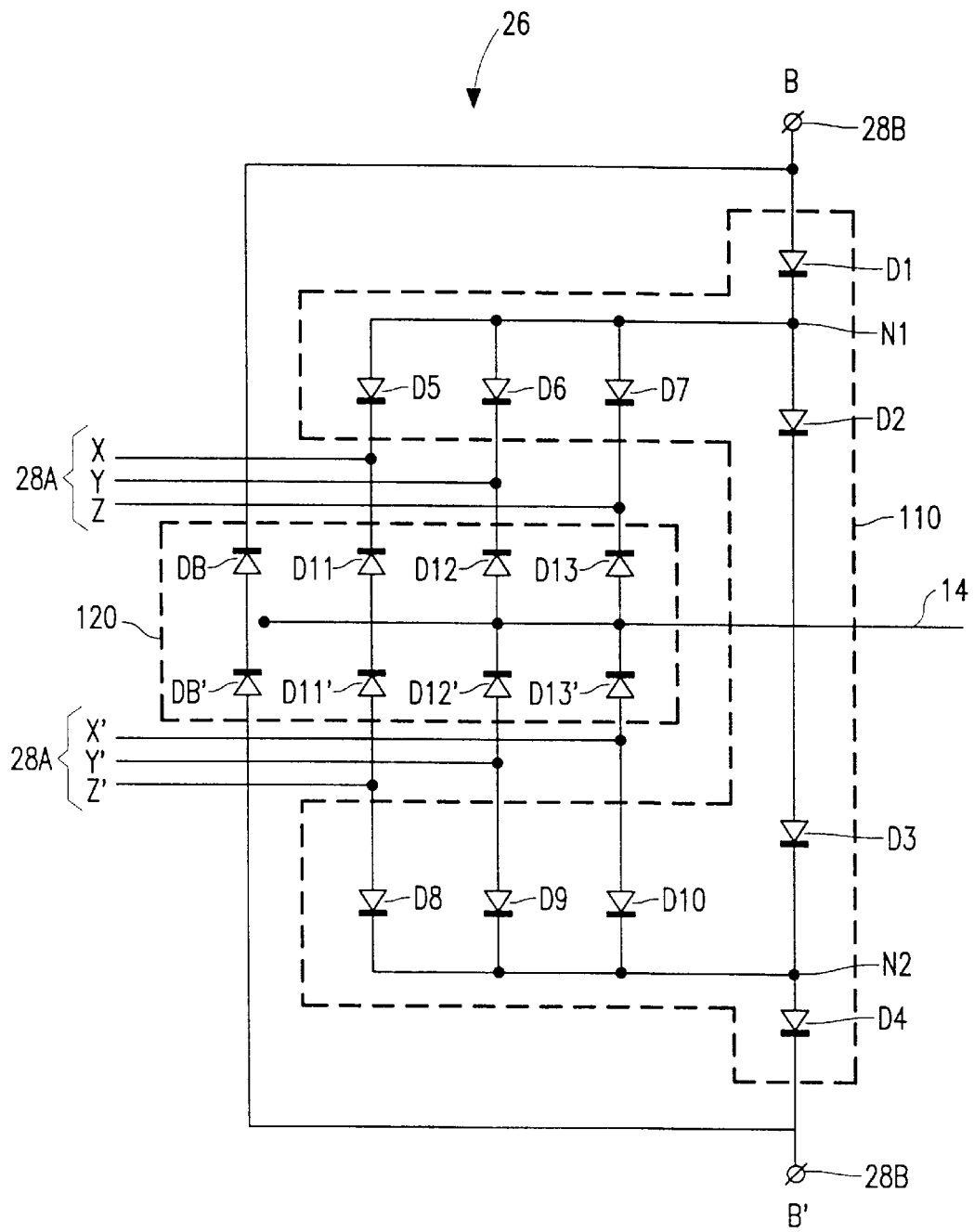
FIG. 9 shows a second multiplexer switching circuit according to the invention, based on switches of the first embodiment for a multiplexer having its outputs divided into blocks.

FIG. 9 shows a modification of the multiplexer switch 26 of the first embodiment to enable the rows of the array to be subdivided into blocks. As shown in FIG. 9, the holding portion 120 of the multiplexer switch 26 includes a diode pair DB, DB' connected between the second set 28B of control lines, namely terminal B and terminal B'. The diode pair DB, DB' functions in the same way as the diode pairs D11,D11' to D13,D13'. Thus, when the switch is selected and terminal B has a high voltage and terminal B' has a low voltage, the switch 26 functions in exactly the same way as the switch 26 shown in FIG. 3. The diode pair DB, DB' plays no part in the operation of the switch, and the control lines 28A enable the switch to supply the select voltage or the hold voltage to the row conductor 14. However, the multiplexer switch 26 as a whole may be turned off by switching the signals on the terminals B and B', so that terminal B is at a low level and terminal B' is at a high level. In this way, no currents flow through diodes D1 to D4 and the output on the row conductor 14 is determined by the potential divider action of the diodes DB, DB'. These diodes may be significantly smaller than the diodes D1 to D4. A switch in an unselected block, although supplying the hold voltage, will therefore consume less power than a switch 26 of a selected block which is providing the hold voltage to the row conductor 14. The table in FIG. 4 shows that the second levels for the terminals B and B', −2.5 Volts and 2.5 Volts respectively, also result in the row conductor 14 having a voltage of 0 Volts applied to it when a switch 26 is in a block which has been turned off.

The multiplexer switch 260 of the second embodiment does not need modification to enable the rows of the array to be sub-divided into blocks. Of course, if the sub-division into blocks is not required, then the terminal 280B does not require two levels as shown in FIG. 6. During the off condition of the switch 260 as a whole, which is produced when the terminal 280B is driven to the low voltage (−15 Volts from FIG. 6), each of the diodes D100, D200, D50, D60 and D70 are reverse biased thereby reducing the current flowing in the switch 260.

Figure 10:
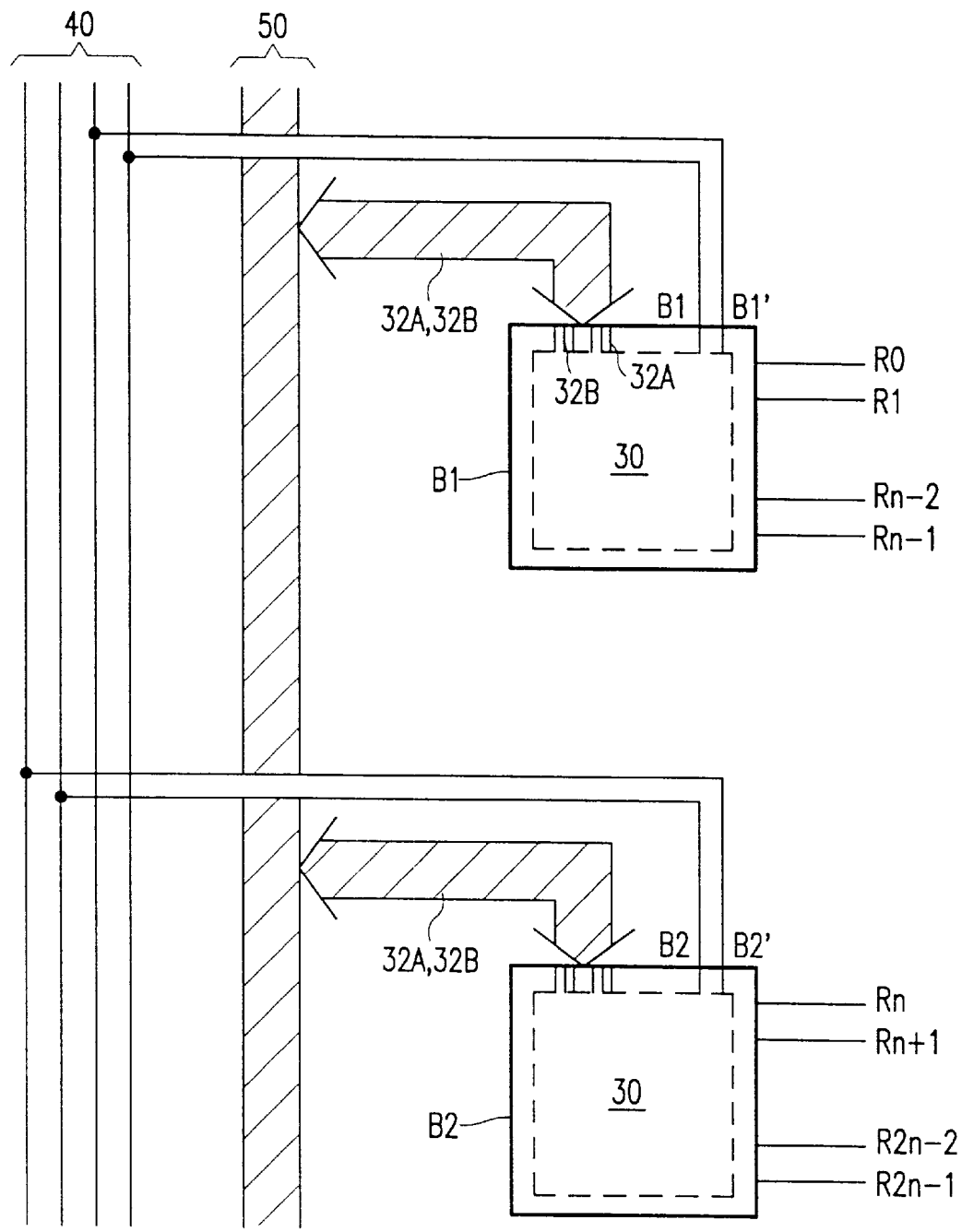
FIG. 10 shows a multiplexer circuit configuration using the multiplexer switching circuits of FIG. 9.

FIG. 10 shows a multiplexer circuit according to the invention in which the use of blocks has been made. Each block B1, B2 includes a multiplexer circuit 30 corresponding to that shown in FIG. 7 in which the multiplexer switches 26 comprise the switches shown in FIG. 9. Thus, different block inputs B1, B1' and B2, B2' are input to the multiplexer 30 of each block. Different blocks are addressed by different block lines which together form a block bus 40. The number of lines contained in the block bus 40 will be twice the number of blocks into which the rows are divided, since each block requires an individual pair of block signals B, B' (which comprise the second set 28B, of control lines 28). The blocks each share the same addressing lines 32 which are supplied from an address line bus 50.

The use of blocks reduces the multiplexer ratio for the circuit but reduces the overall currents flowing, as explained above. There is therefore a trade-off between the overall current flowing in the multiplexer and the achievable multiplexer ratio.

Figure 11:
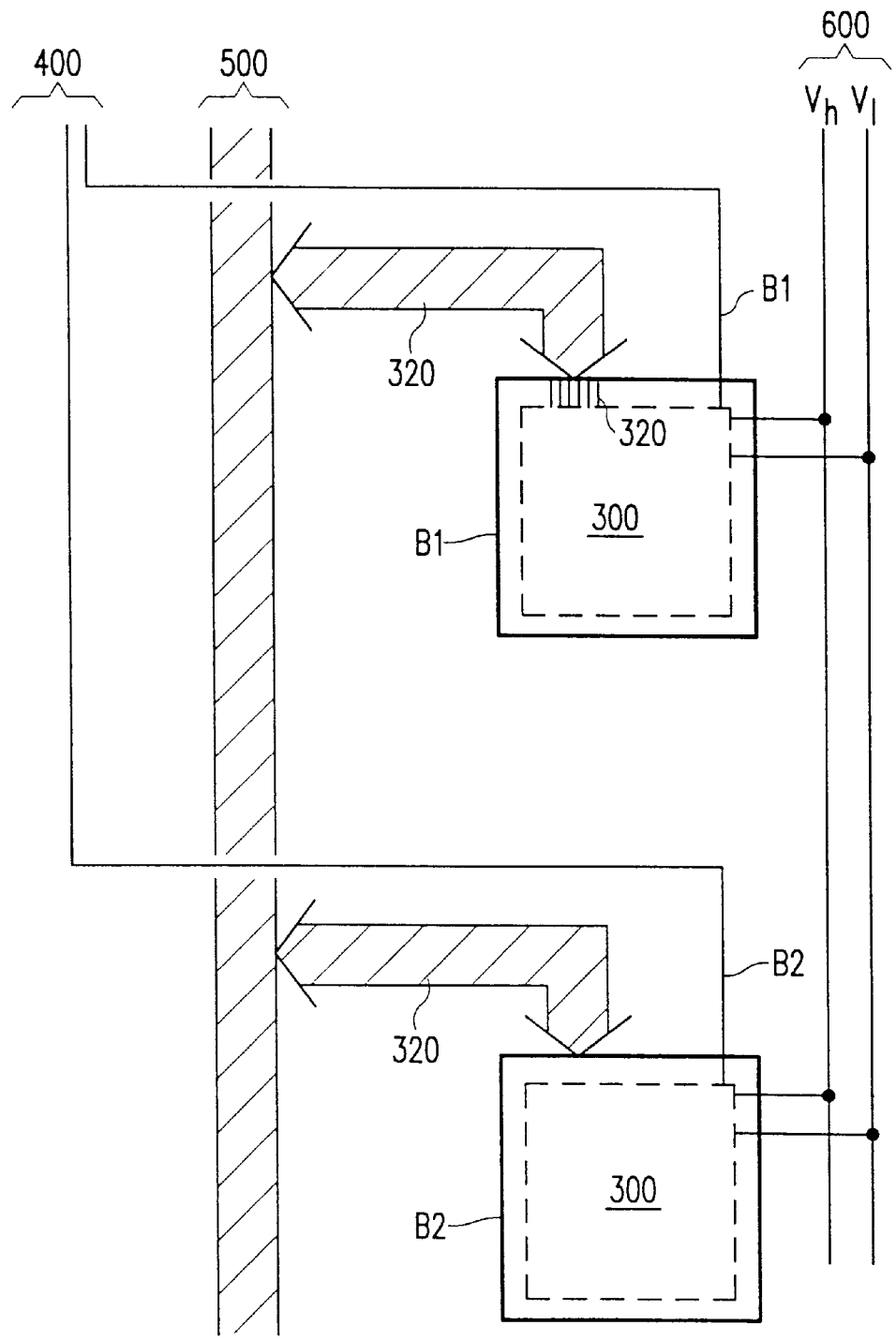
FIG. 11 shows the use of switching circuits of the second embodiment in a multiplexer circuit with the output divided into blocks.

FIG. 11 shows a multiplexer circuit according to the invention using switches 260 of the second embodiment, again in which the use of blocks has been made. An address line bus 500 supplies the control lines to each multiplexer circuit 300 and a block bus 400 supplies a single block line to each block B1 and B2. the blocks again each share the same addressing lines 320 supplied from the address line bus 500. The voltage lines $V_H$ and $V_L$ are shown collectively as Bus 600.

The table in FIG. 12 shows how the total number of inputs (block select inputs together with addressing line inputs) varies depending upon the number of lines in the first set 28A or 280A of control lines (R in equation 1) and the number of blocks selected. The calculations assume that the number of addressing lines 32 or 320 is double the number of control lines in the first set 28A or 280A and the total number of such control lines (i.e. P) is given in the table. This gives the highest multiplexer ratio for the multiplexer circuits 30 of each block. In this case, the multiplexer ratio for each circuit 30 is given by:

$$M = \frac{P!}{\left(\frac{P}{2}\right)! \times \left(\frac{P}{2}\right)!} \quad (2)$$

The values given in FIG. 12 give the number of control lines and the number of blocks required, for each embodiment, to achieve a minimum number of rows to be addressed of 2,500.

As explained above, if only a single block is to be used, which is permanently turned on, this gives the highest multiplexer ratio since 3,432 rows may be addressed using only 30 inputs (first embodiment) or 17 inputs (second embodiment). As the table in FIG. 12 shows, it is at least desirable to utilise three blocks since the same number of inputs are required to address the minimum of 2,500 rows. As the number of blocks increases further the multiplexer ratio decreases but, of course, the total current flowing in the multiplexer also reduces as the number of blocks is increased.

It is, of course, possible to construct a range of different designs for a given number of row outputs by varying the number of blocks, the number of address lines to the multiplexer circuit of each block by adding to the number of control inputs to each switch 26 or 260. The overall design should be optimised for a particular application depending upon such factors as the required power consumption.

The invention provides a multiplexer circuit which may be fabricated from all diode technology, and which may therefore easily be integrated onto the array of electrical elements, particularly when these elements comprise diode based pixels such as shown in FIG. 1. However, the circuit may be used for addressing other arrays of elements for example a diode ROM array. The image sensor pixels may conceivably comprise a known configuration of two thin film transistors and a photosensitive diode in each pixel. In this case, the diodes shown in the Figures may comprise diode-connected thin film transistors which may then be fabricated using the same processing steps as for the electrical elements.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A multiplexer circuit for addressing a plurality of electrical elements, comprising a plurality of switching circuits each for supplying a hold voltage or a select voltage to an associated electrical element, each switching circuit including an output which is coupled to the associated electrical element, a driving circuit for driving the output to the select voltage, and a holding circuit for driving the output to the hold voltage, each switching circuit comprising a plurality of select control inputs each having a respective first control level and a respective second control level, wherein all of the control inputs are driven to the first control level to enable the driving circuit, and wherein one or more of the control inputs are driven to the second control level to disable the driving circuit, each switching circuit comprising a different combination of select control inputs selected from a plurality of control lines of the multiplexer circuit.

2. A circuit as claimed in claim 1, wherein all of the control inputs are driven to the first control level to enable the driving circuit and to disable the holding circuit, and wherein one or more of the control inputs are driven to the second control level to disable the driving circuit and to enable the holding circuit.

3. A circuit as claimed in claim 2, wherein the outputs of the holding circuit and of the driving circuit each comprise a voltage divider arrangement.

4. A circuit as claimed in claim 2, wherein the holding circuit and the driving circuit comprise diode-based circuits.

5. A circuit as claimed in claim 1, wherein the select control inputs comprise associated pairs of select control inputs, a first group of select control inputs comprising one input from each pair of select control inputs, and a second group of select control inputs comprising the other input from each pair of select control inputs, each pair of select control inputs being driven to their respective first or second control levels substantially simultaneously, and wherein the driving circuit includes an AND gate which supplies the select voltage to the output when all of the first group of control inputs are at the first control level, and the holding circuit comprises an OR gate which supplies the holding voltage to the output when any of second group of control inputs are at the second control level.

6. A circuit as claimed in claim 5, wherein the first control level is a high level and the second control level is a low level for the first group of control inputs, and the first control level is a low level and the second control level is a high level for the second group of control inputs.

7. A circuit as claimed in claim 5 wherein the AND gate and OR gate comprise diode circuits.

8. A circuit as claimed in claim 5, wherein the holding circuit comprises at least two series connected diodes connected between each associated pair of control inputs, the point of connection of each pair of diodes being connected to the output of the switching circuit, such that when the select control inputs are each driven to the first control level, the diodes are turned off, and when at least one pair of select control inputs is driven to the second control level, the associated diodes are turned on and the output is determined by the respective values of the second control levels of the at least one pair of select control inputs.

9. A circuit as claimed in claim 8, wherein when a pair of select control inputs is driven to the second control level, the output of the switching device is equal to the midpoint of the second control levels for the pair of select control inputs, and wherein the midpoint of the second control levels for each pair of select control inputs are each equal to the holding voltage.

10. A circuit as claimed in claim 5, wherein the driving circuit comprises first and second drive inputs, each having first and second control levels.

11. A circuit as claimed in claim 10, wherein the driving circuit comprises first and second series connected drive switching circuits connected between the drive inputs, the point of connection of the pair of drive switching circuits being connected to the output of the switching circuit, one group of select control inputs being connected to the first drive switching circuit, and the other group of select control inputs being connected to the second drive switching circuit, such that when the control inputs are each driven to the first control level the first and second drive switching circuits are turned on and the output is determined by the respective values of the first and second drive inputs, and when at least one pair of control inputs is driven to the second control level the first and second drive switching circuits are turned off.

12. A circuit as claimed in claim 11, wherein each drive switching circuit includes an AND gate comprising a first diode connected between the associated drive input and a control port of the drive switching circuit, and a second diode connected between the control port of the drive switching circuit and the output of the switching circuit, the select control inputs each being connected to the control port through respective diodes, such that a current either flows between the drive input and the output of the switching circuit in the on condition of the drive switching circuit, or between the drive input and one or more control inputs, the second diode being reverse biased, in the off condition of the drive switching circuit.

13. A circuit as claimed in claim 10, wherein the drive inputs comprise block select lines, the electrical elements being divided into a plurality of blocks each comprising a plurality of electrical elements, the block select lines comprising block control inputs supplied to the holding circuit, such that if a block select line is driven at the second control level, the holding circuit supplies the holding voltage to the output of the switching circuit.

14. A circuit as claimed in claim 13, wherein the same select control inputs are supplied to the different blocks of electrical elements.

15. A circuit as claimed in claim 1 wherein the driving circuit includes an AND gate, the output of which is coupled to the associated electrical element when all of the control inputs are driven to the first control level, and which is isolated from the electrical element when one or more control inputs are driven to the second control level, the holding circuit supplying a holding voltage to the electrical element when the output of the AND gate is isolated from the electrical element.

16. A circuit as claimed in claim 15, wherein the output of the AND gate is coupled to the associated electrical element through a respective diode which is forward biased when all of the control inputs are driven to the first control level and which is reverse biased when one or more control inputs are driven to the second control level.

17. A circuit as claimed in claim 16, wherein the holding circuit comprises a voltage source which defines the hold voltage when the output of the AND gate is isolated from the electrical element, and which, in combination with the driving circuit, defines the voltage at the output when all of the control inputs are driven to the first control level.

18. A circuit as claimed in claim 17, wherein the holding circuit comprises a pair of series connected diodes coupled between respective voltage sources, the point of connection of the two diodes being connected to the output of the switching circuit.

19. A multiplexer circuit as claimed in claim 1, comprising an array of electrical elements arranged in rows and columns, rows of electrical elements being addressed by said multiplexer circuit.

20. A multiplexer circuit as claimed in claim 19, comprising an image sensor having said array of electrical elements, the electrical elements comprising image sensing pixels.

* * * * *